(12) United States Patent
Yin et al.

(10) Patent No.: US 6,984,893 B2
(45) Date of Patent: Jan. 10, 2006

(54) LOW TEMPERATURE NITRIDE USED AS CU BARRIER LAYER

(75) Inventors: Zhiping Yin, Boise, ID (US); Eden Zielinski, Boise, ID (US); Fred Fishburn, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/303,585

(22) Filed: Nov. 22, 2002

(65) Prior Publication Data

US 2003/0071358 A1 Apr. 17, 2003

Related U.S. Application Data

(62) Division of application No. 09/503,105, filed on Feb. 11, 2000, now Pat. No. 6,492,267.

(51) Int. Cl.
*H01L 23/48* (2006.01)

(52) U.S. Cl. .................. 257/762; 257/758; 257/774
(58) Field of Classification Search .......... 257/760, 257/761, 750, 751, 753, 758, 762, 763, 764, 257/774; 438/687, 624, 625, 622, 627, 629
See application file for complete search history.

(56) References Cited

U.S. PATENT DOCUMENTS

| 4,513,021 | A | | 4/1985 | Purdes et al. |
| 5,103,285 | A | | 4/1992 | Furumura et al. |
| 5,563,102 | A | | 10/1996 | Michael |
| 5,818,071 | A | | 10/1998 | Loboda et al. |
| 5,831,283 | A | | 11/1998 | Batey et al. |
| 6,159,857 | A | * | 12/2000 | Liu et al. ............... 438/687 |
| 6,174,810 | B1 | | 1/2001 | Islam et al. |
| 6,255,217 | B1 | | 7/2001 | Agnello et al. |
| 6,271,595 | B1 | * | 8/2001 | McGahay et al. .......... 257/762 |

OTHER PUBLICATIONS

Tanaka et al., "Low-k film for Cu interconnects Integration Fabricated by Ultra Low Temperature Thermal CVD", Symposium on VLSI Technology Digest of Technical Papers, 1999, pp 47–48.*

Audisio et al, "Silicon nitride coatings on copper", J. Electrochem. Soc.: Electromemical Science and Technology, vol. 119 No. 4, 1972 pp 408–411.

* cited by examiner

*Primary Examiner*—Laura Schillinger
*Assistant Examiner*—Thanhha Pham
(74) *Attorney, Agent, or Firm*—Knobbe Martens Olson & Bear LLP (57) ABSTRACT

A method of depositing a non-conductive barrier layer onto a metal surface wherein the resistance of the metal remains substantially unchanged before and after the non-conductive barrier layer deposition. The deposition process provides a low temperature processing environment so as to inhibit the formation of impurities such as silicide in the metal, wherein the silicide can adversely increase the resistance of the underlying metal.

5 Claims, 6 Drawing Sheets

LOW TEMPERATURE NITRIDE USED AS CU BARRIER LAYER

RELATED APPLICATIONS

This application is a divisional of prior U.S. patent application Ser. No. 09/503,105, filed Feb. 11, 2000 now U.S. Pat. No. 6,492,267, which is hereby incorporated by reference in its entirety.

BACKGROUND OF THE INVENTION

1. Field of the Invention

This invention relates to integrated circuit processing and, more particularly, to a process for depositing a non-conductive barrier layer such as a nitride film onto a copper surface.

2. Description of the Related Art

A high density integrated circuit typically comprises numerous electrical devices and conductors formed on multiple layers of conducting and semiconducting material that are deposited and patterned in sequence onto a substrate surface. Additionally, insulating material is typically positioned between the individual devices so as to electrically isolated the devices from one another. In particular, intermediate insulating layers, better known as interlevel dielectrics (ILDs), are typically interposed between conducting layers in a circuit so as to electrically isolate components formed on adjacent layers. The insulating layers inhibit electrical shorts and preserve device integrity.

An integrated circuit is operable when its individual components are interconnected with an external source and with one another. In particular, designs of more complex circuits often involve electrical interconnections between components on different layers of the circuit as well as between devices formed on the same layer. Such electrical interconnections between components are typically established through electrical contacts formed on the individual components. The contacts provide an exposed conductive surfaces on each device where electrical connections can be made. However, in a multilayer, high density integrated circuit, the components are often buried in internal sublayers of the circuit where insulating material are deposited over the components making the establishment of electrical contacts difficult.

One method of creating electrical contacts on devices located in the sublayers of the circuit is by forming openings in the interlevel dielectrics (ILDs) that are deposited over the components. The openings, known as contact vias or holes, typically extend downwardly from a top surface of the ILD to the layer containing the electrical devices so that a top surface of the device is exposed. Furthermore, the openings are then filled with a conductive material, such as copper, which effectively establishes electrical contact for components located underneath the ILD.

In addition to contact via, trenches can also be etched onto the surface of the insulating material in a desired pattern for a conductor layer in a process that is commonly known as the damascene process. In a typical damascene process, the trenches are etched on the surface of the insulating material comprising an ILD and subsequently metalized so as to produce integrated conductors. In particular, the trenches are metalized in a similar manner as that of the contact vias wherein the trenches are filled with a conductive material so as to establish a desired conductive path.

The metalization process generally involves depositing a layer of conductive material such as copper into the vias or trenches, thereby interconnecting electrical devices and wiring at various levels. In a multilayer integrated circuit assembly, an insulating layer is typically deposited onto the metalized vias or trenches so as to electrically isolated the metalized vias or trenches from additional circuit layers that will be formed in a stacked configuration above the vias or trenches. In particular, the insulating layer typically comprises an oxide material such as silicon dioxide wherein the oxide electrically isolates devices formed on adjacent circuit layers. Disadvantageously, however, the oxide layer will lose its insulating properties when copper or other conductive material diffuses from the underlying adjacent layer into the oxide layer. In particular, metal that migrates into an insulating oxide layer can effectively short out the devices electrically isolated by the layer.

To address this problem, a non-conductive barrier layer is generally interposed between the conductive layer and the adjacent insulating layer wherein the barrier layer inhibits metal from diffusing into the insulating layer. In particular, a non-conductive barrier layer typically comprises a nitride film and is preferably positioned between a top surface of a copper wiring layer and a bottom surface of an adjacent oxide layer so as to inhibit copper from migrating upwardly into the oxide layer. Furthermore, the nitride film can be deposited onto the copper surface by using well known deposition techniques such as evaporation, sputtering, chemical vapor deposition, or plasma enhanced chemical vapor deposition (PECVD).

However, one disadvantage of the standard nitride PECVD process is that the nitride film is known to react with a top surface of the copper layer during the deposition process and will consequently alter the electrical properties of the copper. In particular, the copper and nitride reaction is shown to substantially increase the copper line resistance, which in turn will delay signal-transmission between devices. Slow signal transmission is not favored in most semiconductor devices, particularly in high speed, high density integrated circuits. Furthermore, high speed integrated circuits generally require conductors with low electrical resistance so as to facilitate current flow and signal transmission. Therefore, a reduction in copper line resistance is not only desirable but necessary in light of the constant demand for integrated circuits with higher speed and increased device density.

Hence, from the foregoing, it will be appreciated that there is a need for a process of depositing a non-conductive barrier layer so that any increase in the electrical resistance of the underlying conductive wiring or contact is reduced. To this end, there is a particular need for a process of depositing a non-conductive barrier layer wherein the barrier layer will not unfavorably increase the copper line resistance.

SUMMARY OF THE INVENTION

The aforementioned needs are satisfied by the method of forming a conductive interconnect integrated circuit of the present invention. In one aspect, the present invention comprises a method of depositing a layer of non-conductive barrier film onto a layer of conductive material wherein the deposition process does not affect the electrical resistance of the metal, so that the resistance of the conductive material remains substantially the same before and after the deposition of the non-conductive barrier layer.

In one embodiment, the method comprises depositing a silicon nitride non-conductive barrier layer onto a copper surface is provided wherein the method includes a low temperature plasma enhanced chemical vapor deposition process (PECVD) wherein the PECVD process temperature range is held between 150 C–300 C. In particular, the low temperature range as disclosed in the present invention is shown to inhibit a reaction between the silicon nitride and copper that typically occurs during the standard high temperature (400° C.) silicon nitride PECVD process. Such reaction between the silicon nitride and copper is generally not favored as it results in the formation of silicide in the copper, which in turn will unfavorably increase the line resistance of the copper.

Furthermore, the undesired silicide formation in copper is also known to occur in a reaction between the silane gas used as part of the PECVD process and the exposed copper surface when the PECVD process is conducted in a high temperature environment as taught by prior art. In contrast, the process parameter as disclosed by the preferred embodiment is shown to inhibit this particular reaction between the silane gas and copper so as to further inhibit the formation of silicide in copper. Alternatively, a layer of amorphous silicon carbide is also shown to be an effective non-conductive barrier layer that does not unfavorably increase the resistance of the copper. Preferably, the amorphous silicon carbide is deposited onto the copper surface using a similar PECVD process with a process temperature of approximately 400 C.

From the foregoing, it will be appreciated that the aspects of the present invention provide a method of depositing a non-conductive barrier layer onto a metal surface without increasing the resistance of the metal. In particular, the method provides a novel low temperature plasma enhanced chemical vapor deposition (PECVD) process wherein the low temperature processing environment is shown to inhibit the formation of silicide in the copper, thereby avoiding the undesired increase in copper line resistance that will otherwise result from using known PECVD process parameters. These and other objects and advantages of the present invention will become more apparent from the following description taken in conjunction with the following drawings.

DETAILED DESCRIPTION OF THE PREFERRED EMBODIMENT

Reference will now be made to the drawings wherein like numerals refer to like parts throughout. As will be described herein below, the process of the preferred embodiment provides a method of depositing a non-conductive barrier layer onto a copper surface wherein the barrier layer comprises a nitride film.

Figure 1:
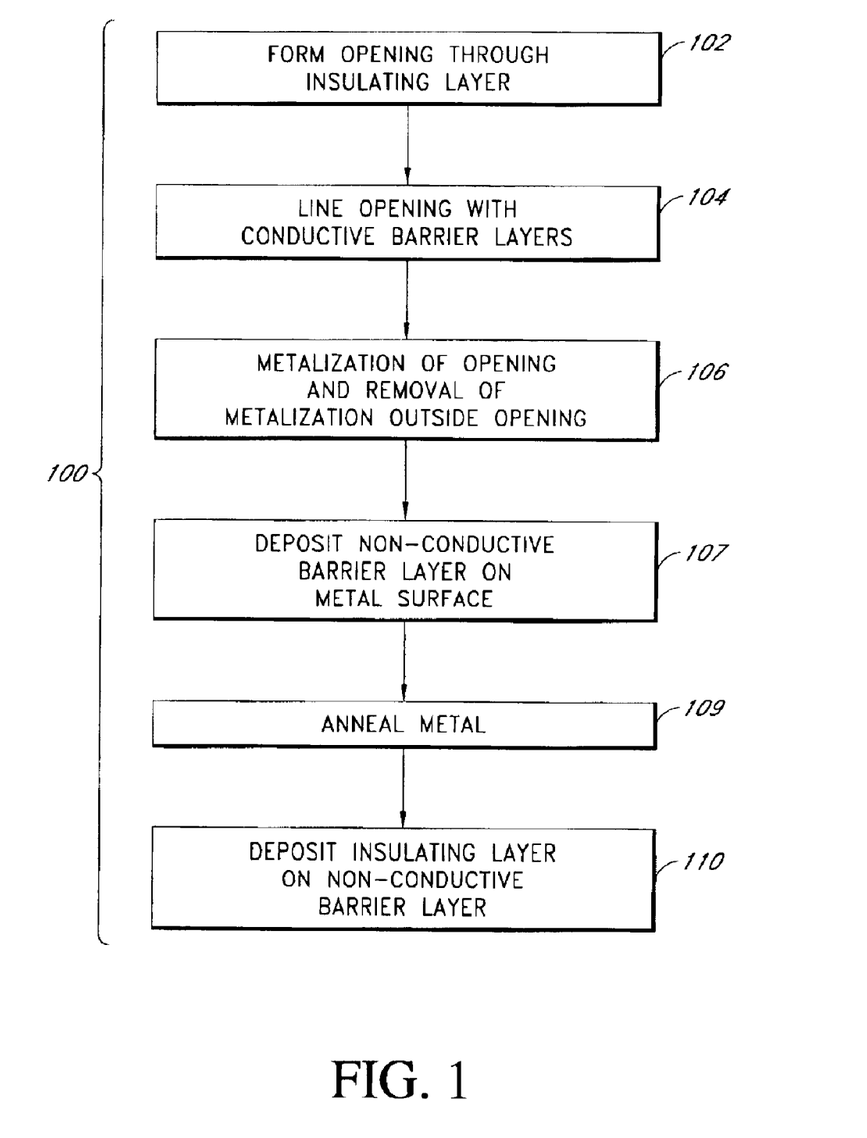
FIG. 1 is a flow diagram illustrating a process for forming a conductive layer into an opening on a substrate assembly, depositing a layer of non-conductive barrier layer on the conductive layer, and subsequently forming an insulating layer on the non-conductive barrier layer, in accordance with a preferred embodiment of the present invention.

FIG. 1 schematically illustrates a process flow 100 of the preferred embodiment of forming a non-conductive barrier film between a top surface of a conductive layer and a bottom surface of an insulating layer. As shown in FIG. 1, the process begins with a first step 102 comprising the formation of an opening through an insulating layer. As will be shown in greater detail below, the openings generally extend downwardly from a top surface of the insulating layer so as to either expose an underlying conductive surface for electrical contact or so as to extend into the insulating layer to thereby define a trench adapted to receive a conductive trace. Furthermore, the openings are typically formed on the insulating layer by a well known masking and etching process and will be subsequently filled with a conductive material so as to form electrical contacts in a manner to be described in greater detail below.

As FIG. 1 further illustrates, following the formation of the opening, a second step 104 comprises lining the opening with a conductive barrier layer using a method known in the art. As will be shown in greater detail below, in the illustrated embodiment, the conductive barrier layer comprises a thin layer of metal nitride deposited along the walls of the opening so that it conforms to the contours of the opening. The metal nitride layer confines the deposited metal to the opening while still allowing the deposited metal to maintain electrical contact with any underlying device that is exposed by the opening.

As is also shown in FIG. 1, subsequent to conductive barrier deposition, a third step 106 of the preferred embodiment comprises the metalization process wherein a layer of conductive material such as copper is deposited into the opening. Preferably, the copper is electroplated onto the metal nitride liner and fills the entire opening. After metalizing the opening, copper is removed from the non-recessed areas. Preferably; the copper is removed by chemical mechanical polishing. After the copper removal from the non-recessed areas, a non-conductive barrier layer is preferably deposited onto the metalized surface in a fourth step 107 as shown in FIG. 1. The non-conductive barrier layer effectively prevents metal from diffusing upwardly into a subsequently deposited, adjacent insulating layer. Preferably, the non-conductive barrier layer comprises a nitride film, such as silicon nitride, and is deposited onto the metal surface using a deposition process such as plasma enhanced chemical vapor deposition (PECVD).

As will be described in greater detail below, the standard PECVD process for nitride deposition is generally run at a temperature of approximately 400 C. At such elevated temperature, a reaction is known to occur between the nitride film and a top surface of the copper wherein the reaction alters the electrical properties of the copper so as to substantially increase the copper line resistance. In particular, the high-temperature reaction between silicon nitride and copper induces the formation of silicide in the copper. Furthermore, in a high temperature processing environment, the silane gas from the PECVD process is also known to react with the copper surface and induces similar formations of suicides in the copper. However, copper doped with suicides has a higher electrical resistance than that of pure copper. Moreover, copper line resistance is an important electrical property as it directly affects the speed of signal transmission. As it can appreciated, conductors with high resistance are not favored in most semiconductive devices as high conductor resistance delays signal transmission, which in turn slows the speed of the circuit.

As will be described in greater detail below, the present invention provides a novel method of eliminating the undesired increase in copper line resistance that typically results from silicon nitride deposition process using known PECVD process parameters. In particular, the preferred method provides a nitride deposition process wherein the new process parameters comprise a generally lower temperature range so as to inhibit the silane gas and nitride film from reacting with the underlying copper surface. As will be described in greater detail below, the copper line resistance remains substantially unchanged after nitride deposition when the process is conducted in a low temperature PECVD environment as disclosed by the preferred embodiment. In contrast to known nitride deposition methods that typically take place in a relatively high temperature chamber, the present method provides a lower temperature process environment so as to prevent the formation of silicide in the copper and therefore reduce the adverse increase in line resistance which could otherwise result if the traditionally known PECVD process parameters are used.

Preferably, as shown in a fifth step 109 of FIG. 1, the copper contact or wiring having a film of low temperature nitride deposited on its top surface is subsequently annealed so as to ensure that the copper line resistance remains substantially constant. Following annealing, a layer of insulating material is then deposited on a top surface of the nitride film in a sixth step 110 so as to isolate the underlying copper contact or wiring from devices to be formed on subsequent layers. As will be described in greater detail below, the nitride film inhibits the underlying copper from diffusing upwardly into the insulating layer so as to prevent electrical shorting between devices isolated by the insulating layer.

The process will now be described in connection with a particular configuration of an integrated circuit. It will be appreciated that the process of the preferred embodiment can be implemented on any of a number of circuit configurations without departing from the spirit of the present invention and the embodiments described herein are simply illustrative of one implementation of the process.

Figure 2:
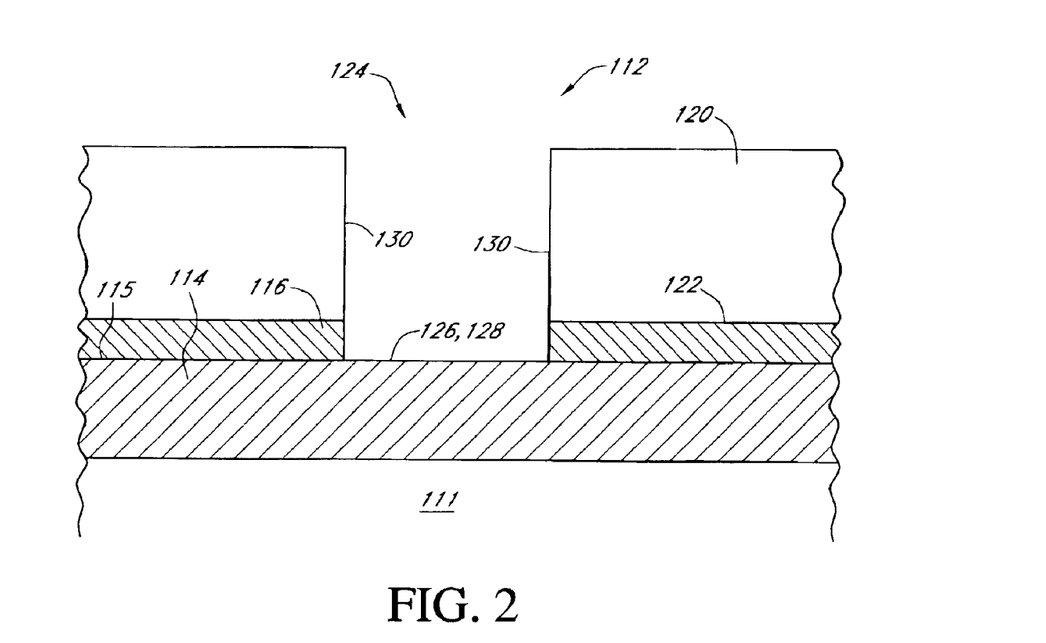
FIG. 2 is a partial elevational cross-section of a partially fabricated integrated circuit or substrate assembly, showing a conventional interlevel dielectric and a contact via therethrough, exposing a conductive circuit element beneath the via.

FIG. 2 illustrates a partially fabricated integrated circuit or substrate assembly 112 wherein the structure is formed above a substrate 111, which may comprise a single crystal wafer or other semiconductive layer in which active or operable portions of the electrical devices are formed. In particular, the substrate assembly 112 of the illustrated embodiment represents, for example, an integrated circuit such as a dynamic random access member (DRAM) circuit. As FIG. 2 further illustrates, a conductive layer 114 is formed above the substrate 111 in a manner well known in the art. Preferably, the conductive layer 114 comprises copper or aluminum, although it can be appreciated that there are other suitable conductive materials, depending on the function and desired conductivity of the circuit element. In the illustrated embodiment, the conductive layer 114 forms a conductive runner or wiring layer which comprises numerous contact landing pads for electrical interconnection. A buffer layer 116, such as a non-conductive barrier layer or anti-reflective layer from the previous processing, may be present as well. Preferably, the buffer layer 116 is approximately 0.03–0.10 microns thick.

FIG. 2 further illustrates that an interlevel dielectric layer (ILD) 120 is formed on a top surface 122 of the buffer layer 116. In one embodiment, the ILD 120 can comprise a layer of borophosphosilicate (BPSG) and has a thickness adequate to electrically insulate underlying conductors from overlying conductors, which depends upon circuit design and operational parameters. In particular, the ILD 120 of the preferred embodiment is between 0.40–0.60 microns thick and is deposited on the buffer layer 116 using well known deposition techniques, such as chemical vapor deposition.

As it is further shown in FIG. 2, a contact via or hole 124 is etched throughout the ILD 120 to expose an underlying conductive circuit element 126 on the conductive layer 114. Although FIG. 2 illustrates a metalization process for contact vias, it can be appreciated that the same process can be applied to metalizing other integrated circuit features, such as trenches. In the illustrated embodiment, the via 124 is narrow due to circuit design constraints. In particular, the via 124 preferably has a width of less than about 0.25 microns, resulting in aspect ratios greater than about 2.0. The via 124 is preferably defined by conventional photolithographic techniques and anisotropic etching so as to produce substantially vertical via sidewalls 130. The via 124 is formed so that electrical contact can be established with the underlying circuit element 126 that is exposed by the via 124. As FIG. 2 further shows, the circuit element 126 exposed by the etched via 124 comprises a contact landing pad 128 of an underlying conductive runner or wiring layer 114.

Figure 3:
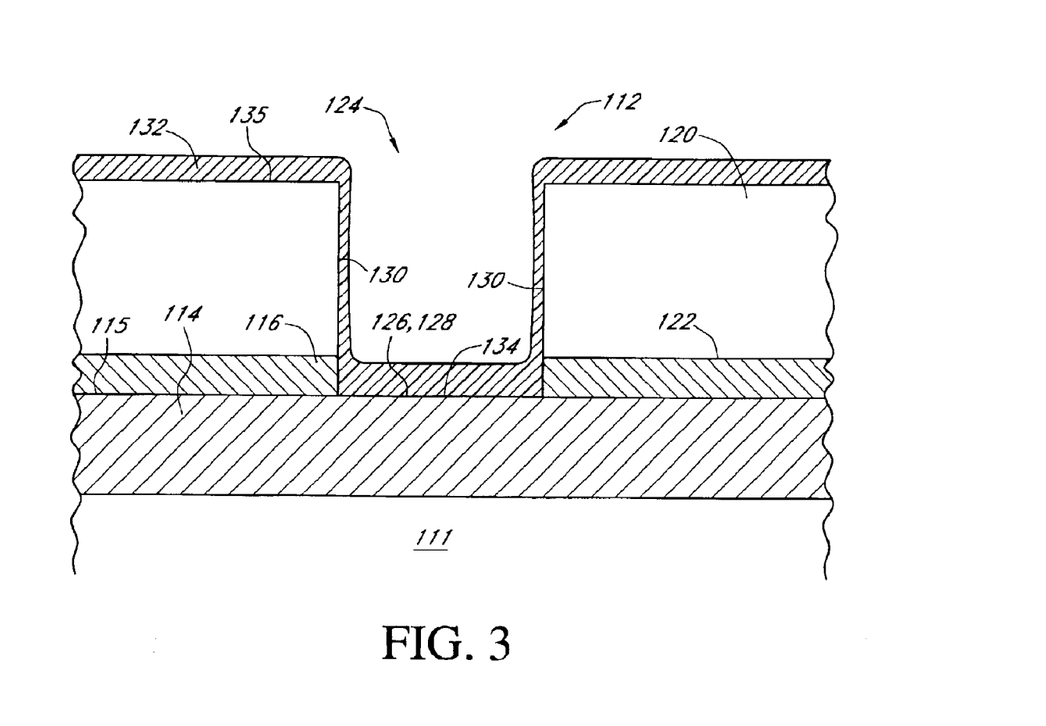
FIG. 3 is a partial elevational cross-section of the substrate assembly of FIG. 2 illustrating a layer of conductive barrier material that is deposited into the via defined by the opening.

With reference to FIG. 3, a conductive barrier layer 132 such as a metal nitride liner is deposited over a top surface 134 the contact landing pad 128, the side walls 130 of the via 124, and a top surface 135 of the ILD layer 120. Preferably, the conductive barrier layer 132 is deposited by physical vapor deposition (PVD) and is relatively thin, having a thickness of approximately 0.01 to 0.1 microns. In the illustrated embodiment, the conductive barrier layer 132 comprises titanium nitride. The purpose of the metal nitride barrier layer is to prevent eutectic alloying between the metal to be filled into the vias 124 and the metal that comprises the contact landing pad 128. Moreover, the barrier layer 132 also inhibits diffusion of the metal deposited in the opening 124 into the ILD layer 120 which could degrade the insulating properties of the ILD layer 120.

Figure 4A:
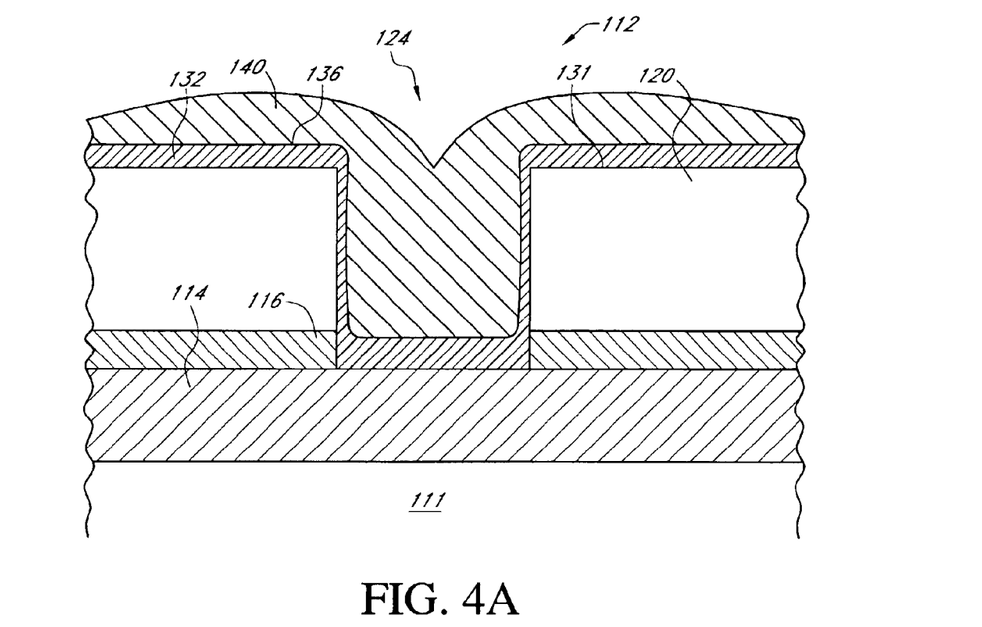
FIG. 4A is a partial elevational cross-section of the substrate assembly of FIG. 3 illustrating a layer of copper that has been deposited onto the conductive barrier layer.
Figure 4B:
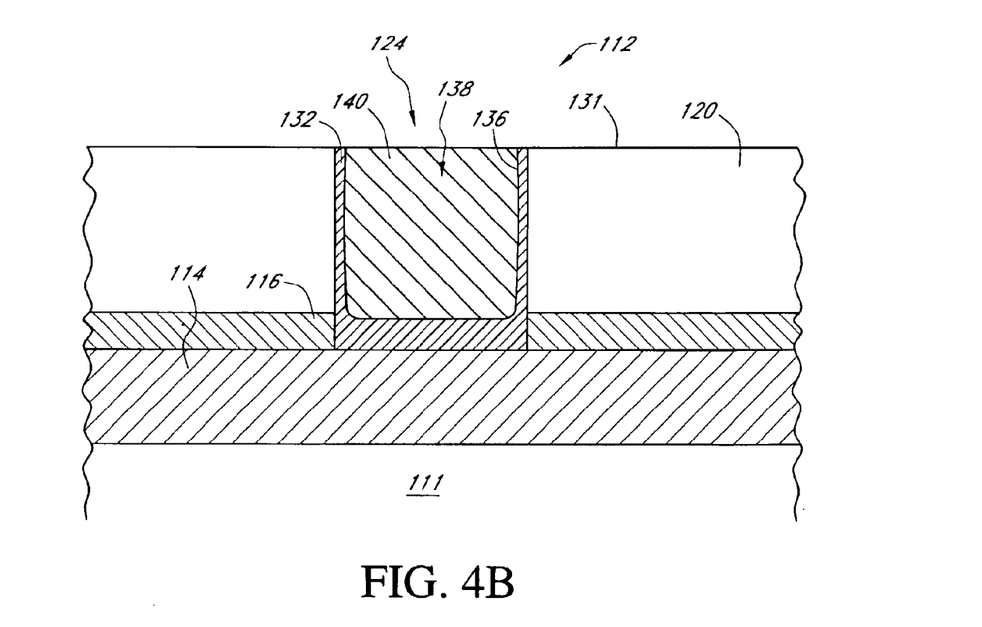
FIG. 4B is a partial elevational cross-section of the substrate assembly of FIG. 3 illustrating a layer of copper that has been deposited onto the conductive barrier layer and removed from the open areas.

In the preferred embodiment, as shown in FIGS. 4A, 4B a layer of conductive material 140, such as copper, is subsequently deposited on a top surface 136 of the conductive barrier layer 132 in a well known manner so as to complete the formation of electrical contact over the conductive layer 114. Preferably, the layer of copper 140 overfills the entire opening 124 of the contact via 124 as illustrated in FIG. 4A. Preferably, the copper is electroplated onto the conductive barrier surface 136 using a well known copper plating solution such as copper sulfate. Following metalization, copper 140 and the conductive barrier layer 132 are removed from the raised areas, defined by a top surface 131 of the isolation layer 120. leaving copper 140 only in a recessed region 138 as shown in FIG. 4B. As it can be appreciated, FIG. 4B is merely schematic, as the contact formation may be planarized, leaving a contact plug to define wiring layers in the portions of the conductive barrier layer 132 and copper filler 140 as shown in FIG. 4B.

Figure 5:
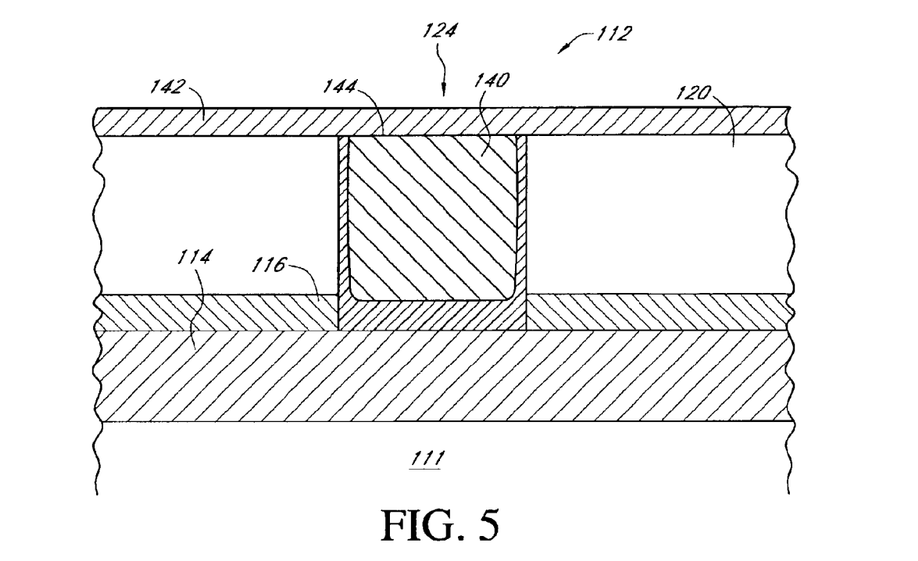
FIG. 5 is a partial elevational cross-section of the substrate assembly of FIG. 4 illustrating a layer of non-conductive barrier layer that is deposited onto the copper layer.

With reference to FIG. 5, a non-conductive barrier layer 142 is formed on a top surface 144 of the conductive layer 140 so as to inhibit the metal 140 from diffusing upwardly into a subsequently deposited, adjacent insulating layer. It can be appreciated that metal diffusing into the insulating layer will degrade the insulating properties and possibly short out devices isolated by such layer. As such, a non-conductive barrier layer is typically interposed between the insulating layer and its underlying conductive layer so as to prevent the underlying metal from migrating upwardly into the insulating layer.

Preferably, the non-conductive barrier layer 142 comprises a nitride film, such as silicon nitride, and is 300 Å (100–1000 Å) thick. Preferably, the non-conductive barrier layer is deposited using a known deposition process such as plasma enhanced chemical vapor deposition (PECVD). As described above, the standard PECVD nitride deposition process is generally run at an elevated temperature in the range of 400 C. Disadvantageously, at an elevated temperature, a reaction is known to occur between the silicon nitride film and a top surface of the copper wherein the reaction alters the electrical properties of the copper so as to substantially increase the copper line resistance. In particular, the high temperature reaction results in the formation of silicides in the copper. Furthermore, a high temperature PECVD processing environment also induces the silane gas used in the deposition process to react with the copper surface and thereby also leads to the formation of silicide in the copper. However, copper doped with an impurity such as silicide typically exhibits a higher resistance than that of pure copper.

In the preferred embodiment, the PECVD process parameters are designed to inhibit the formation of silicide on the copper surface so as to prevent the adverse increase in line resistance that typically results from using the standard PECVD process parameters known in the art. In particular, the preferred process operating temperature is lowered so as to inhibit silicon nitride or silane gas from reacting with copper wherein the reaction is known to contribute to silicide formation. In one embodiment, the preferred PECVD process parameters designed for low temperature nitride deposition are as follows:

| | |
|---|---|
| Deposition Temperature: | 150–300 C. |
| Pressure: | 3.0–6.5 torr |
| RF Power: | 100–750 W |
| Space: | 400–600 mils |
| SiH$_4$ flow: | 20–150 sccm |
| NH$_3$ flow: | 20–200 sccm |
| N$_2$ flow: | 0–3500 sccm |
| He flow: | 0–2000 sccm |

In contrast to the standard PECVD process, the preferred embodiment discloses a process that operates at a substantially lower temperature, preferably between 150 C–300 C. The lower temperature effectively inhibits the formation of silicide that typically occurs in a high temperature process environment, as the silicide results from reactions between the copper surface and the silicon nitride film or silane gas used as part of the PECVD process. Alternatively, instead of using silicon nitride, a layer of amorphous silicon carbide can also be used as the non-conductive barrier film. Similar to the deposition of silicon nitride, the layer of amorphous silicon carbide can be formed on the top surface 144 of the conductive layer 140 using a similar PECVD process, with a process temperature set at approximately 400 C.

In another embodiment, an annealing process follows the non-conductive metal deposition process so as to ensure that the electrical resistance of the underlying copper stays constant throughout the remaining processing steps. In this embodiment, the annealing process comprises heating the copper to a temperature of 100–300 C for 0.1 to 10 minutes.

Figure 6:
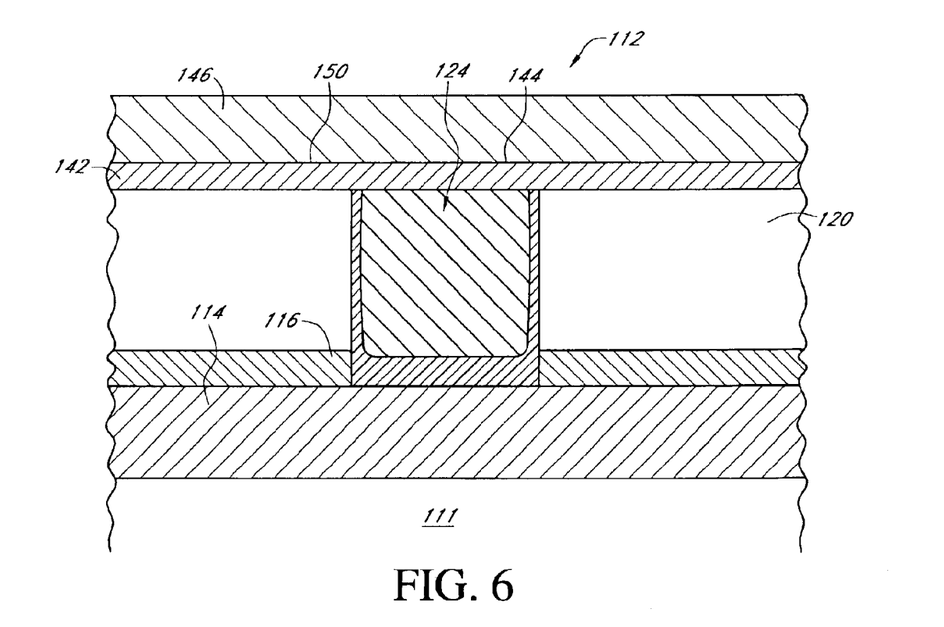
FIG. 6 is a partial elevational cross-section of the substrate assembly of FIG. 5 illustrating a layer of isolation material that is deposited onto the non-conductive barrier layer.

As is generally shown in FIG. 6, subsequent to the deposition of the non-conductive barrier film and annealing of copper, a layer of insulating material 146 is deposited on a first surface 150 of the barrier film 142. Preferably, the insulating layer 146 comprises a commonly known oxide such as silicon oxide and is deposited using a well-known deposition technique. The insulating layer 146 is preferably 0.5 to 2.0 microns thick and electrically isolates the underlying conductive layer 140 from subsequently formed electrical devices. Furthermore, additional conductive and insulating layers can be sequentially deposited onto the insulating layer 146 so as to complete the formation of a typical multilayer circuit.

Figure 7:
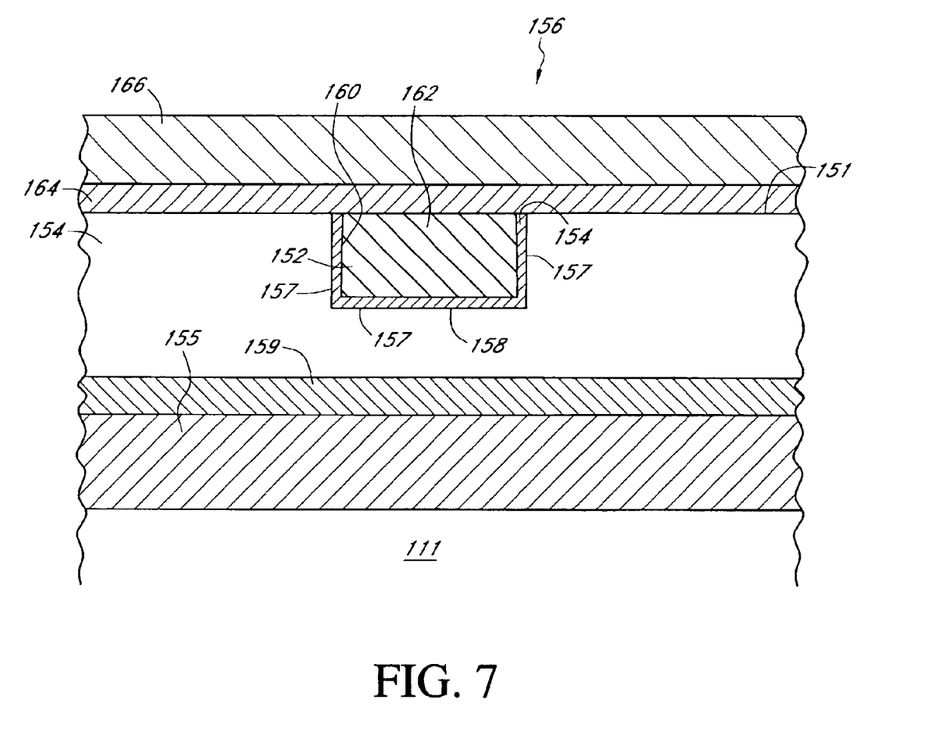
FIG. 7 is a partial elevational cross-section of a partially fabricated integrated circuit or substrate assembly, showing a conventional interlevel dielectric and a trench therethrough, wherein the trench is metalized, a layer of non-conductive barrier material is interposed between the metal and a top layer of isolation material.

In another embodiment as illustrated in FIG. 7, the low temperature deposition process of the present invention can also be used for depositing a nitride film on a top surface of a metalized trench. As is shown in FIG. 7, a trench 152 is formed in an isolation layer 154 of a substrate assembly 156 having a substrate 151. As FIG. 7 further shows, the trench 152 is formed in the isolation layer 154 and extends downwardly from a top surface 151 of the isolation layer 154 to an intermediate region 158 wherein an antireflective layer 159 and a conductive layer 155 underneath the isolation layer 154 remain unexposed. Furthermore, a conductive barrier layer 154 such as a titanium nitride film is deposited along the top surface 151 of the isolation layer 154 and along an inner surface 157 defined by the trench 152. Furthermore, the electroplating process deposits a layer of conductive material 162 such as copper onto the top surface 160 of the conductive barrier layer 154, followed by removal of copper from the non-recessed areas, and finally by the deposition of a layer of non-conductive barrier 164 such as silicon nitride.

Preferably, the silicon nitride layer is deposited using a low temperature PECVD process as described above. As previously discussed, the low temperature silicon nitride film is interposed between the copper 162 and a subsequently deposited, adjacent insulating layer 166 as shown in FIG. 7. In particular, the silicon nitride film of the preferred embodiment not only prevents copper from diffusing into the insulating layer 166, but also will not react with the copper so as to form undesired silicide in the copper. As described in detail above, the low temperature PECVD process inhibits the reaction between the copper and silicon nitride so as to not compromise the copper purity and undesirably increase its line resistance.

Figure 8:
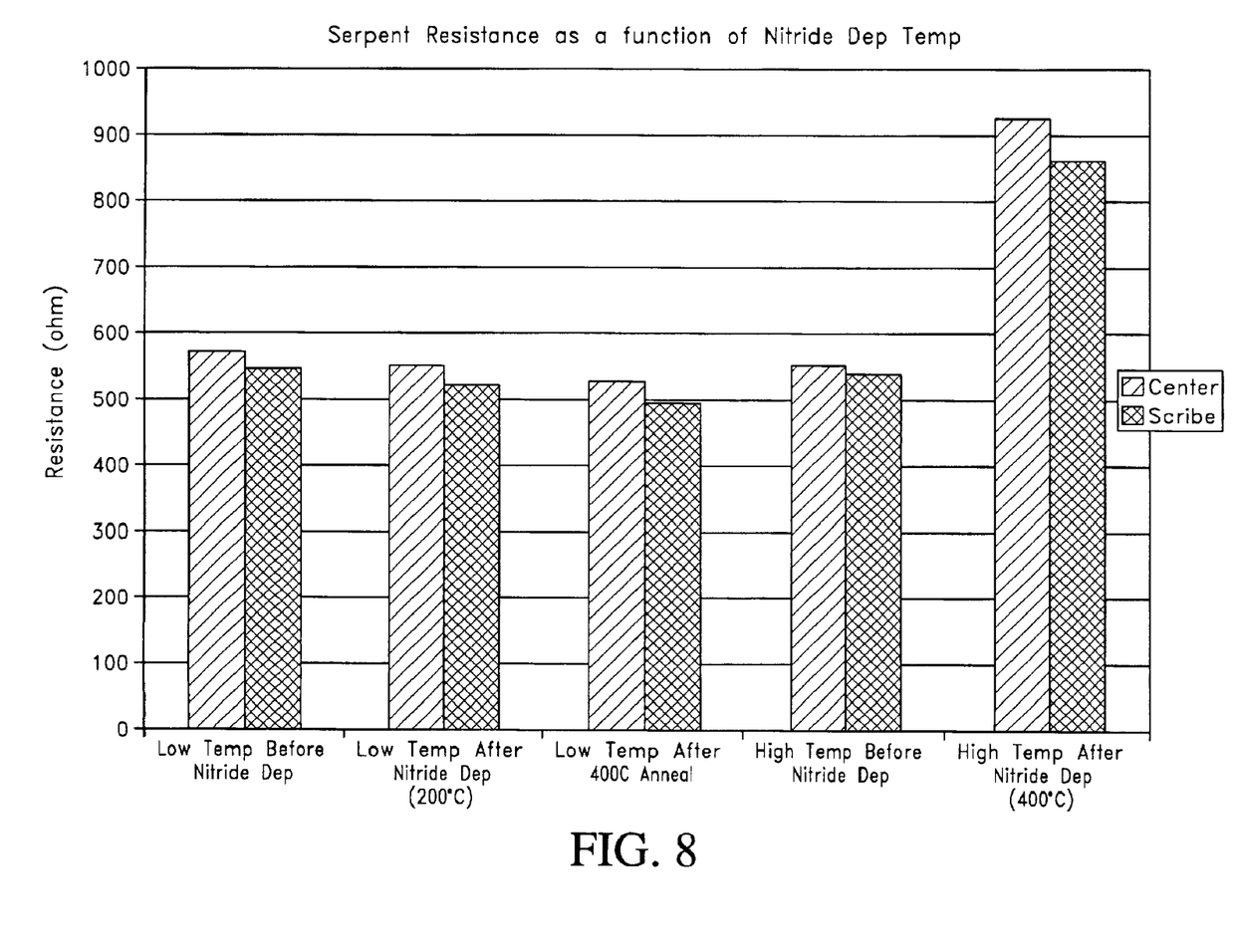
FIG. 8 is a bar graph illustrating a comparison of the copper line resistance of substrate assemblies that are processed using the standard high temperature deposition process versus substrates processed in a low temperature process environment as disclosed in the preferred embodiment.

Furthermore, FIG. 8 illustrates the electrical resistance of sample circuits processed according to the PECVD parameters as disclosed in the preferred embodiment as well as sample circuits that underwent the traditional high temperature nitride PECVD process. The resistance is preferably measured from a test circuit pattern commonly known as a serpent pattern formed on each sample circuit. As FIG. 8 indicates, there is a substantial reduction in resistance when circuits are processed in a low temperature environment as suggested by the preferred embodiment. In particular, as is shown in FIG. 8, line resistance 200 of circuits processed using the preferred embodiment results in an approximately 45 percent reduction in line resistance 202 from those processed using known PECVD process parameters.

Moreover, as is shown in FIG. 8, circuits processed under the preferred PECVD parameters do not significantly change in resistance before and after nitride deposition, whereas circuits processed under the traditional method experience a roughly 45 percent gain in resistance following nitride deposition. Furthermore, it is also shown in FIG. 8 that the line resistance of circuits processed using the preferred embodiment 208 remains virtually unchanged even after an annealing process that occurs at a relatively higher temperature of 400 C.

Hence, the disclosed embodiment provides a method to deposit a non-conductive barrier layer such as silicon nitride onto a copper surface wherein the barrier layer is inhibited from reacting with the copper and consequently does not significantly alter the electrical properties of the conducting material. In particular, the nitride film is deposited using a PECVD process with process parameters that significantly deviate from the standard process. Specifically, the process temperature is substantially lowered so as to inhibit the formation of silicide that typically results from the standard PECVD silicon nitride deposition process.

Hence, the process can be used to form integrated circuits or substrate assemblies having isolation layers, such as ILD layers with openings formed therein that receive conductive material such as copper. Moreover, a non-conductive barrier layer deposited on the copper layer can be used to prevent upward diffusion of copper into a subsequently deposited, insulating layer. Advantageously, the preferred nonconductive barrier layer deposition process inhibits the formation of silicide, an impurity in copper that typically results from the deposition process and is known to substantially increase the resistance of the copper. Therefore, the preferred deposition process provides a layer of non-conductive barrier that effectively prevents copper from migrating upwardly into subsequent insulating layers and yet does not result in unfavorable increases in copper line resistance.

Although the foregoing description of the preferred embodiment of the present invention has shown, described and pointed out the fundamental novel features of the invention, it will be understood that various omissions, substitutions, and changes in the form of the detail of the apparatus as illustrated as well as the uses thereof, may be made by those skilled in the art, without departing from the spirit of the invention. Consequently, the scope of the present invention should not be limited to the foregoing discussions, but should be defined by the appended claims.

What is claimed is:

1. An integrated circuit comprising:

a substrate;

an isolation layer positioned on the substrate wherein the opening is formed in the isolation layer;

a conductive barrier layer formed in the opening, wherein the conductive barrier layer is formed of a material selected so as to inhibit diffusion of conductive species into the isolation layer;

a copper conductor formed in the opening wherein the copper conductor adheres to the conductive barrier layer; and a non-conductive barrier layer formed on the copper conductor said non-conductive barrier layer directly contacts said copper conductor, said non-conductive barrier layer comprises amorphous silicon carbide and is inhibited from chemically reacting with the copper conductor to form silicides in the copper conductor.

2. The integrated circuit of claim 1, wherein the isolation layer comprises an interlevel dielectric (ILD) layer.

3. The integrated circuit of claim 1, wherein the opening comprises a trench.

4. The integrated circuit of claim 1, wherein the non-conductive barrier layer has a thickness of between about 100 to 1,000 Angstroms.

5. An integrated circuit comprising:

a substrate;

an isolation layer positioned on the substrate wherein an opening is formed in the isolation layer;

a conductive barrier layer formed in the opening;

a conductor formed in the opening wherein the conductor adheres to the conductive barrier layer;

a silicon-containing barrier layer formed on the conductor, wherein said silicon-containing barrier layer directly contacts the conductor, wherein the silicon-containing barrier layer comprises amorphous silicon carbide; and an insulating layer formed on said silicon-containing barrier layer, wherein the silicon-containing barrier inhibits diffusion of conductive species from the conductor upwardly into the insulating layer, wherein said silicon-containing barrier layer does not cause silicides to form in the conductor.

* * * * *

UNITED STATES PATENT AND TRADEMARK OFFICE
CERTIFICATE OF CORRECTION

| | |
|---|---|
| PATENT NO. | : 6,984,893 B2 |
| APPLICATION NO. | : 10/303585 |
| DATED | : January 10, 2006 |
| INVENTOR(S) | : Zhiping Yin et al. |

It is certified that error appears in the above-identified patent and that said Letters Patent is hereby corrected as shown below:

At Column 5, Line 16, please delete "suicides" and insert therefore, --silicides--.

At Column 5, Line 17, please delete "suicides" and insert therefore, --silicides--.

At Column 10, in Claim 1, Line 9, please delete "the" and insert therefore, --an--.

At Column 10, in Claim 5, Line 47, before "inhibits" please add --layer--.

Signed and Sealed this

Twenty-first Day of November, 2006

JON W. DUDAS
*Director of the United States Patent and Trademark Office*